(12) United States Patent
Wang et al.

(10) Patent No.: US 7,015,469 B2
(45) Date of Patent: Mar. 21, 2006

(54) ELECTRON HOLOGRAPHY METHOD

(75) Inventors: Yun-Yu Wang, Poughquag, NY (US); Masahiro Kawasaki, Peabody, MA (US); John Bruley, Poughkeepsie, NY (US); Anthony G. Domenicucci, New Paltz, NY (US); Michael A. Gribelyuk, Poughquag, NY (US); John G. Gaudiello, Poughkeepsie, NY (US)

(73) Assignees: Jeol USA, Inc., Peabody, MA (US); IBM Corporation, Armonk, NY (US)

( * ) Notice: Subject to any disclaimer, the term of this patent is extended or adjusted under 35 U.S.C. 154(b) by 194 days.

(21) Appl. No.: 10/755,081

(22) Filed: Jan. 9, 2004

(65) Prior Publication Data

US 2004/0195506 A1  Oct. 7, 2004

Related U.S. Application Data

(60) Provisional application No. 60/438,968, filed on Jan. 9, 2003.

(51) Int. Cl.
*G03H 5/00*  (2006.01)
(52) U.S. Cl. ...................................... 250/311; 250/307
(58) Field of Classification Search .................. 250/311
See application file for complete search history.

(56) References Cited

U.S. PATENT DOCUMENTS

| | | | |
|---|---|---|---|
| 3,761,721 A | 9/1973 | Altshuler et al. | |
| 4,532,422 A | 7/1985 | Nomura et al. | |
| 4,935,625 A | 6/1990 | Hasegawa et al. | |
| 4,998,788 A | 3/1991 | Osakabe et al. | |
| 5,192,867 A | 3/1993 | Osakabe et al. | |
| 5,466,548 A | 11/1995 | Matsui | |
| 5,767,521 A | 6/1998 | Takeno et al. | |
| 6,573,501 B1 * | 6/2003 | Kaneyama et al. | 250/311 |
| 6,617,580 B1 * | 9/2003 | Voelkl | 250/311 |
| 6,759,656 B1 * | 7/2004 | Tomita | 250/311 |
| 2002/0084412 A1 | 7/2002 | Tomita | |

* cited by examiner

*Primary Examiner*—Nikita Wells
*Assistant Examiner*—David A. Vanore
(74) *Attorney, Agent, or Firm*—The Webb Law Firm (57) ABSTRACT

An inline electron holograph method for observing a specimen with a transmission electron microscope having an electron gun, a collimating lens system, two spaced objective lenses, a biprism, and an imaging means comprises the steps of: with the first objective lens forming a virtual image of a portion of the specimen; with the second objective lens focussing the virtual image at an intermediate image plane to form an intermediate image; and projecting the intermediate image onto the imaging means.

5 Claims, 8 Drawing Sheets

ELECTRON HOLOGRAPHY METHOD

RELATED APPLICATION

This application claims priority to provisional patent Application No. 60/438,968, filed Jan. 9, 2003 and incorporates that application by reference.

BACKGROUND OF THE INVENTION

Electron holography has become a desirable technique for inspection of semiconductor devices. The principles of electron holography are described, for example, in U.S. Published Patent Application 2002/0084412 entitled "Electron Microscope Equipped with Electron Biprism," incorporated herein by reference, and U.S. Pat. No. 5,192,867 entitled "Electron Optical Measurement Apparatus".

The requirements for use of electron holography to inspect semiconductor devices are (1) an overlap of the plane wave transmitted through the specimen and the plane wave not transmitted through the specimen in the range of about 50 to 1000 nanometers, (2) fringe spacing between about 1 and 10 nanometers, and (3) adjustability of both the overlap and the fringe spacing. The overlap is roughly equivalent to the field of view. Spatial resolution is approximately twice the fringe spacing. Overlap and fringe spacing can be related. With some prior methods in which only one objective lens was used, if the overlap was satisfactory, the fringe spacing was unsatisfactory. Multiple lens systems have been proposed. A number of methods of using multiple lens systems are possible.

Applicants have discovered a manner of using a two-lens system that provides a satisfactory magnification and fringe spacing for two-dimensional (2D) dopant profiling of semiconductor devices. The method also provides a continuously varying low magnification to high magnification electron holography. The application of this method is not limited to semiconductor 2-D dopant profiling.

SUMMARY OF THE INVENTION

Briefly, according to this invention, there is provided an inline electron holograph method for observing a specimen with a transmission electron microscope having an electron gun, a collimating lens system, two spaced objective lenses, a biprism, and an imaging means. The method comprises with the first objective lens forming a virtual image of a portion of the specimen, with the second objective lens focussing the virtual image at an intermediate image plane to form an intermediate image, and projecting the intermediate image onto the imaging means.

According to a preferred embodiment, the method comprises with the first objective lens forming a virtual image of a portion of the semiconductor device, with the second objective lens focussing the virtual image at an intermediate image plane beyond the biprism to form an intermediate image, adjusting the magnification of both of the objective lenses and the voltage applied the biprism to provide a field of view between 50 and 1,000 nanometers and a fringe spacing of between 1 and 10 nanometers with usable fringe contrast (5%–30%), and projecting the intermediate image onto the imaging means. The method allows fringe width and spacing relative to the object to be varied independently from the fringe contrast, resulting in enhanced resolution and sensitivity for electron holography.

BRIEF DESCRIPTION OF THE DRAWINGS

Further features and other objects and advantages will become apparent from the following detailed description made with reference to the drawings in which.

DESCRIPTION OF THE PREFERRED EMBODIMENTS

Figure 1A:
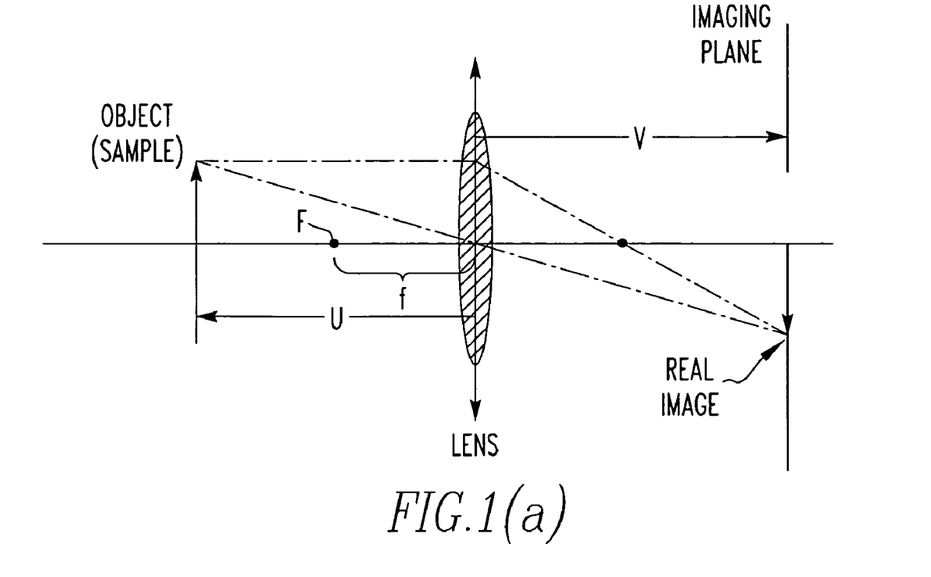
FIGS. 1a and 1b are ray diagrams of single lens system where: a) the object is outside of focal point of the lens and real image is formed behind the lens; and b) the object is between the first focal point and the lens and virtual image is formed further away from the lens than the object.
Figure 1B:
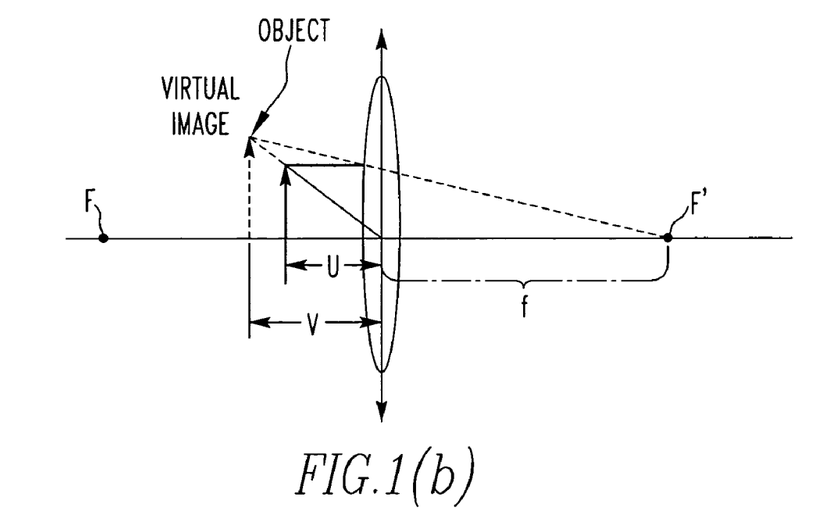

General Theory of Geometric Optics:

FIGS. 1a and 1b illustrate the relationship between object and image position for a single lens system. This relationship is given by:

$$\frac{1}{u} + \frac{1}{v} = \frac{1}{f} \tag{1}$$

where f is the focal length and u and v are the distances from the lens to the object and image, respectively. If the object is before the lens, u>0, if behind u<0. Likewise, if the image is before the lens, v<0, if behind v>0. For this simple single lens system, three imaging possibilities exist: if the object is positioned outside of first focal point of the lens (u>f>0), a real image is formed behind the lens and behind the second focal point (v>f>0). Depending on the distance between the lens and the object, the image can be either magnified or demagnified. As the object moves closer to the first focal point, the magnification increases and the position of the projected real image moves further behind the lens. The ray diagram for this condition is shown in FIG. 1a.

If the object is between the first focal point and the lens (f>u>0), a magnified virtual image is formed and the image position is further away from the lens than the object (v<−u<0). If the first focal point moves closer to the object by increasing the strength of the lens, the magnification of the virtual image increases and position of the virtual image moves even further away from the lens. The ray diagram for this condition is shown in FIG. 1b.

The magnification (M) of a single lens is given by:

$$M = abs\left(\frac{v}{u}\right) = abs\left(\frac{f}{f-u}\right) \quad (2)$$

For the magnetic lenses used in electron optics, the focal length is related to the lens voltage according to the following equation, $$f = \frac{CR^2}{V^2} \quad (3)$$

where C is a constant for a given lens, R is the resistance of the lens coil, and V is the voltage applied to the lens. Since all magnetic lenses are of the converging type, f is always positive. When the voltage of the lens is zero, the focal length is infinity. Increasing the lens voltage (increasing the strength of the lens) decreases its focal length.

Figure 2A:
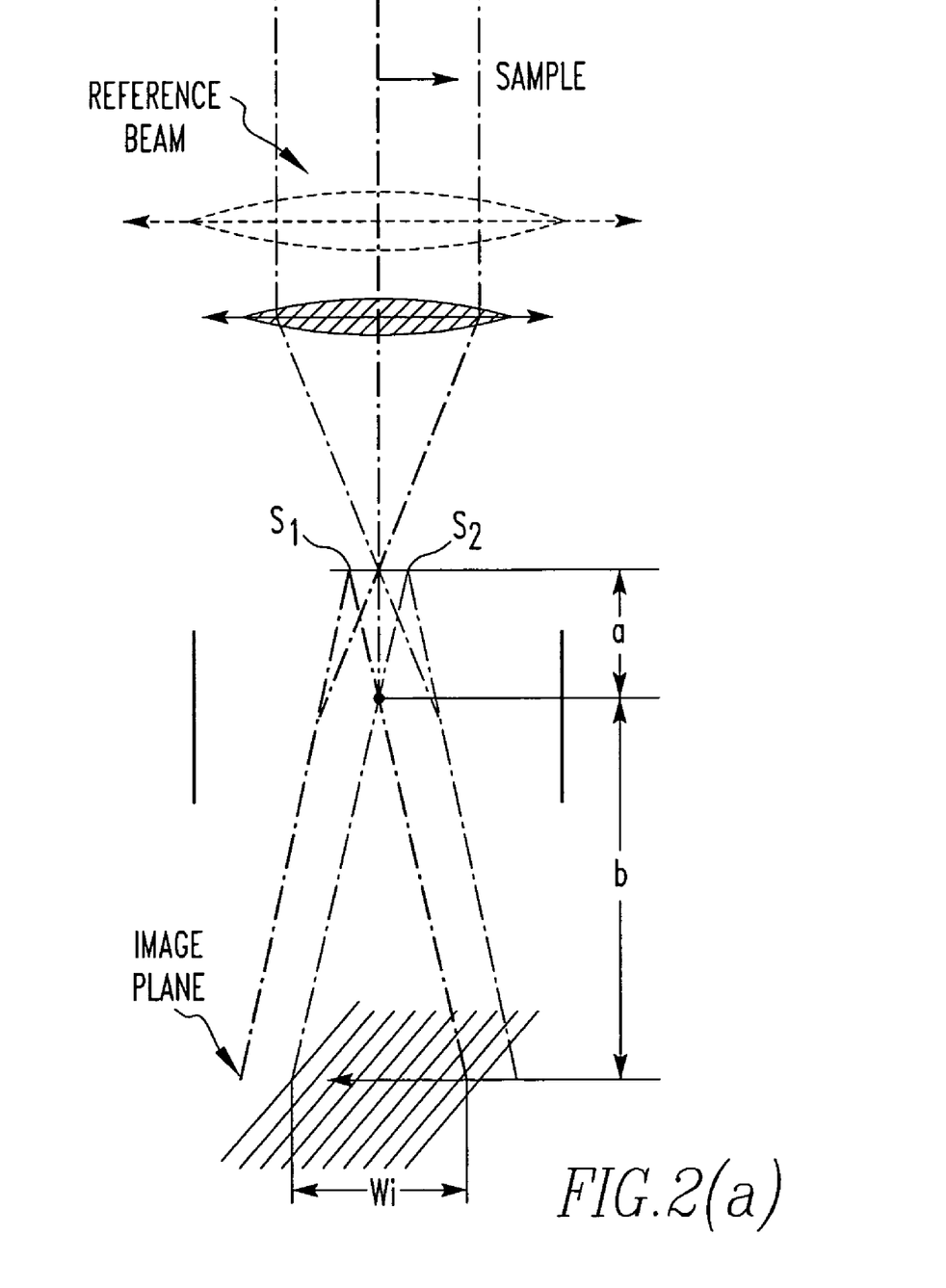
FIGS. 2a and 2b illustrate electron hologram formation using a single lens in a dual lens imaging system. The interference pattern with fringe spacing, $\sigma_i$, and fringe width, $W_i$, is formed by two virtual sources, $S_1$ and $S_2$.
Figure 2B:
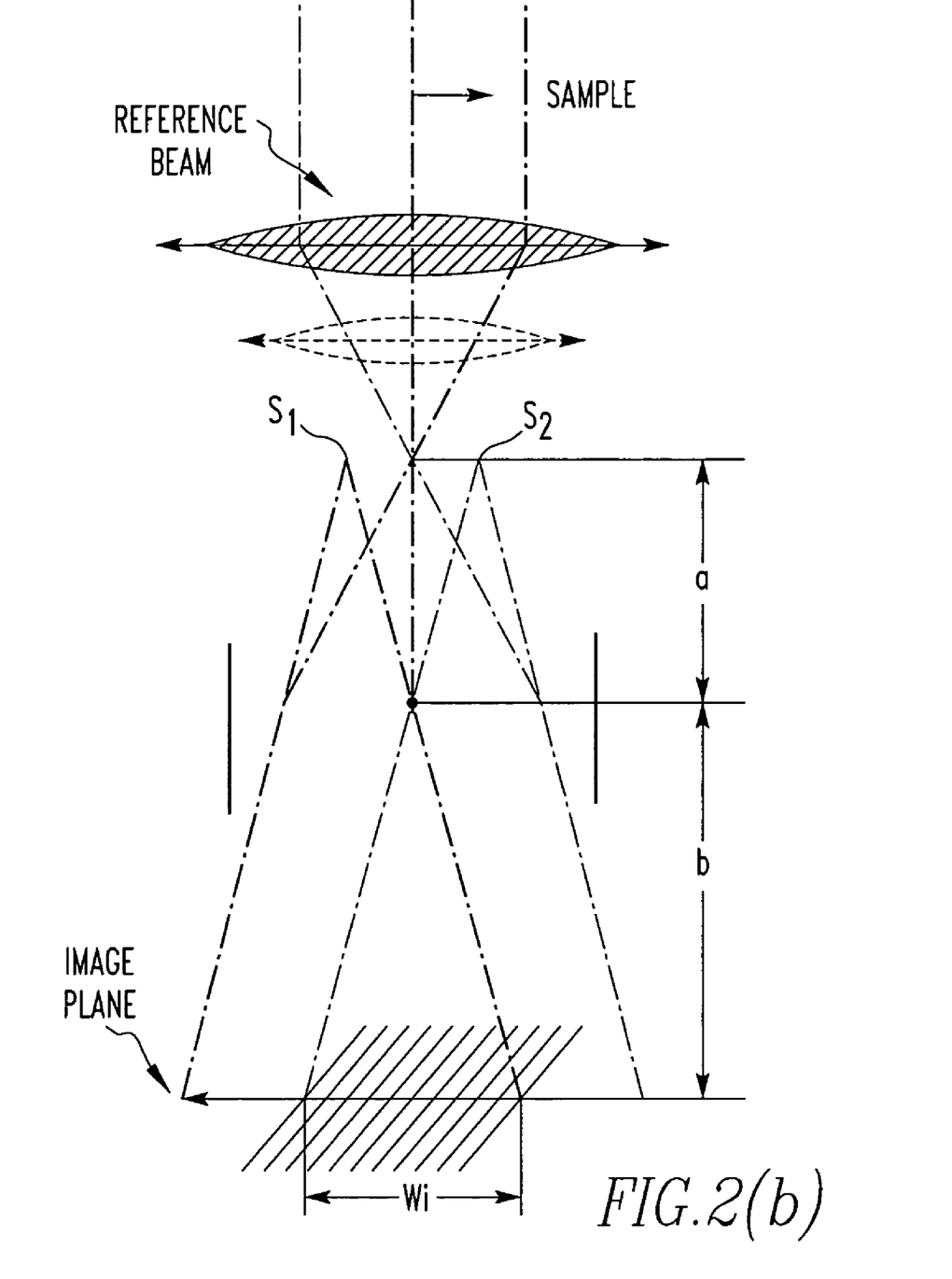

General Theory of Electron Holography:

When a voltage is applied to the biprism, the electron beams from the sample and vacuum are bent to form a band of interference fringes at the image plane. As illustrated in bottom part of FIGS. 2a and 2b, the off-axis electron hologram can be thought of as being formed from two virtual sources, $S_1$ and $S_2$, of finite size ($\delta$) positioned above the biprism and separated by a distance d. Assuming that a is the distance between the virtual sources and biprism position, b is the distance between image plane and the biprism position, $\lambda$ is the wavelength of the electron beam, and $V_b$ is the biprism voltage, the fringe spacing or periodicity, $\sigma_i$, and fringe width, $W_i$, at the image plane were described by Litche as:

$$\sigma_i = \frac{\lambda}{2\gamma_0 V_b}\left(1 + \frac{b}{a}\right) \quad (4)$$

and $$W_i = 2\gamma_0 V_b - 2r_b\left(1 + \frac{b}{a}\right) \quad (5)$$

where $$\lambda_0 = \frac{f_r \pi}{2U_A \ln\left(\frac{r_{bp}}{r_b}\right)} \quad (6)$$

$U_A$ is the accelerating voltage of electron beam, $f_r$ is the relativistic correction, $r_b$ is the radius of the biprism filament, and $r_{bp}$ is the distance to the biprism from the surrounding ground electrode. In any holographic experiment, the fringe spacing, $\sigma_{obj}$, and width, $W_{obj}$, relative to the object are important parameters. These are expressed as:

$$\sigma_{obj} = \sigma_i / M_{obj} \quad (7)$$

and $$W_{obj} = W_i / M_{obj} \quad (8)$$

where $M_{obj}$ is the magnification of the imaging lens(es). The equations above describe three important relationships. First, the fringe spacing is inversely proportional to biprism voltage. Second, if the radius of the biprism filament is small ($r_b < 0.3$ μm), the fringe width is proportional to the biprism voltage. Lastly, the factor which relates the fringe spacing and width in the image plane to that of the object is the magnification of the imaging system.

Fringe contrast is another important parameter in electron holography and is defined as $(I_{max}-I_{min})/(I_{max}+I_{min})$. Contrast determines the signal to noise level of the resulting data and is governed by several factors: biprism voltage ($V_b$) and radius ($r_b$), coherence of the beam, size ($\delta$) and position (a) of the virtual source, and the position of the image plane (b). Based on Litche's notation and wave optics, the fringe contrast (visibility) can be written as:

$$V_{fringe} = \frac{I_{max} - I_{min}}{I_{max} + I_{min}} = \frac{\sin(\beta)}{\beta} \quad (9)$$

where $$\beta = \frac{2\pi\delta}{\lambda} \frac{\gamma_0 b}{a+b} V_b \quad (10)$$

Based on Eqs. (4) and (5), larger biprism voltage leads to larger fringe width and smaller fringe spacing, both preferred for most analysis. However, fringe contrast decreases with increased biprism voltage due to the finite size of the electron source, as indicated by Eqs. (9) and (10). The control of fringe width, spacing, and contrast by varying biprism voltage alone limits the operational range of a TEM set up for electron holography. By altering the magnification of imaging lenses, based on Eqs.(7) and (8), the fringe width ($W_{obj}$) and spacing ($\sigma_{obj}$) can be changed without significantly degrading fringe contrast, extending the operational range for electron holography.

Figure 3:
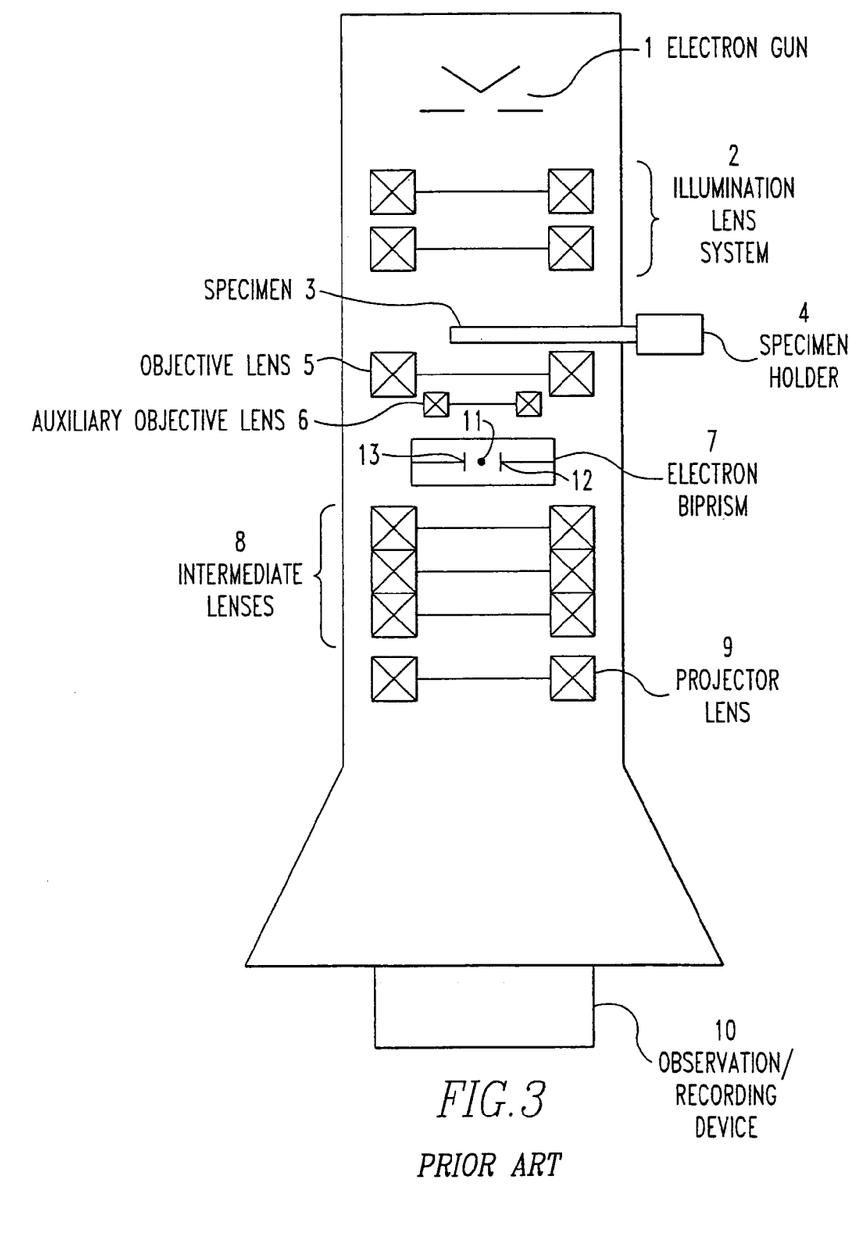
FIG. 3 is a schematic diagram of an electron microscope equipped with an electron biprism useful for the practice of this invention.

Referring now to FIG. 3, a holography electron microscope comprises a TEM having electron optics in which an electron biprism is inserted. Shown are an electron gun 1, an illumination lens system 2, a specimen 3, a specimen holder 4, an objective lens 5, an auxiliary objective lens 6, an electron biprism 7, intermediate lenses 8, a projector lens 9, and an observation/recording device 10. This observation/recording device 10 is made of a fluorescent screen, a photography device, or a TV camera.

When the electron biprism 7 is not operated, the instrument functions as a normal TEM. That is, the electron beam produced by the electron gun 1 is directed onto the specimen 3 via the illumination lens system 2. The electron beam transmitted through the specimen 3 is magnified by a magnification-and-projection system comprising the objective lens 5, the auxiliary objective lens 6, intermediate lenses 8, and the projector lens 9. Finally, the electron beam is projected as a TEM image onto the observation/recording device 10. The electron biprism 7 comprises a filament 11 and two electrodes 12 and 13 located on the opposite sides of the filament 11. The filament 11 is normally made of thin wire of platinum having a diameter of about 0.5 μm. During operation, a positive voltage of hundreds of volts is applied to the filament 11. The electrodes 12 and 13 are grounded. The TEM described in this and the above paragraph is known in the art.

Figure 4:
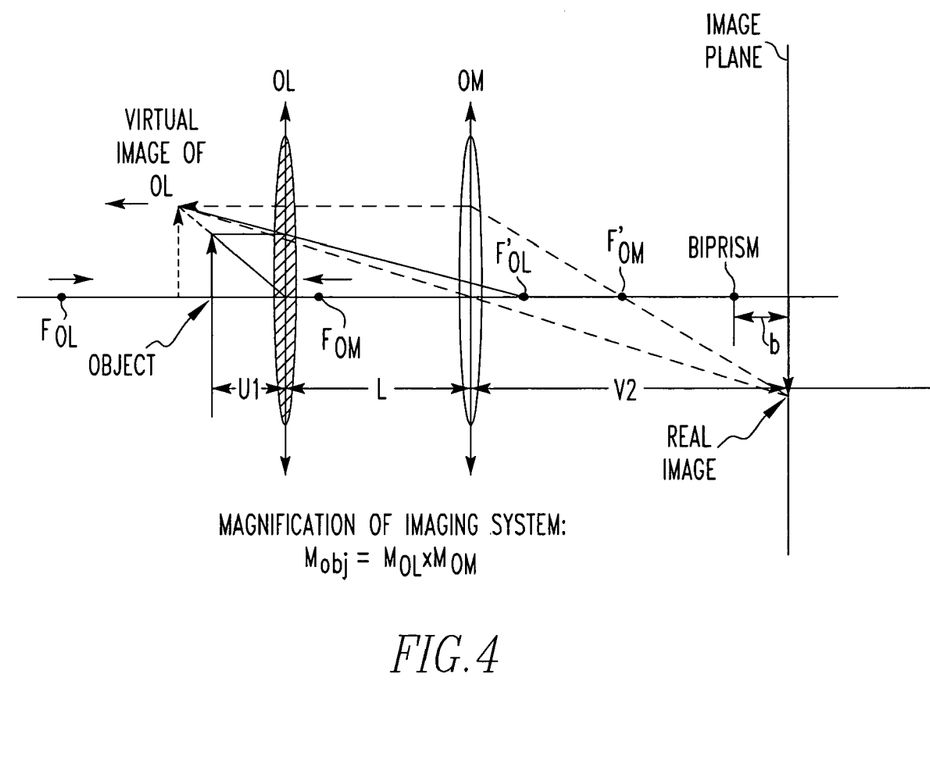
FIG. 4 is a ray diagram of a double lens system adjusted according to the method of this invention with a fixed intermediate image plane.

Referring now to FIG. 4, the method according to this invention is illustrated. With the first objective lens OL, a virtual image of the object or specimen is formed by positioning the object between the focal point $F_{OL}$ and the backside of the objective lens OL. The second objective lens is then used to form a real image at an intermediate image plane beyond the biprism. The total magnification of the imagining system is the product of the magnifications of the first and second objective lenses. The magnification is varied by adjusting the focal length of the first objective lens OL and the focus at the intermediate image plane is made by adjustment of the second objective lens OM.

The magnification for the dual lens system described above can be understood by the considering the following equation (shown in FIG. 4):

$$M_{obj} = M_{OL} \times M_{OM} = \frac{|v_1|}{u_1} \times \frac{v_2}{u_2} = \frac{v_2}{u_1} \frac{1}{1 + \left|\frac{L}{v_1}\right|} \quad (11)$$

where $M_{OL}$ and $M_{OM}$ are the magnification of OL and OM, respectively, $v_1$ and $u_1$ are the image and object position relative to OL, respectively, $v_2$ and $u_2$ are the image and object position relative to OM, and L is the distance between OL and OM. When OL is off, the magnification is $v_2/(L+u_1)$, just as a single lens. If $u_1$, $v_2$, and L are fixed, then moving the first focal point of OL closer to the object by increasing the OL excitation leads to larger value for abs($v_1$) and thus increase magnification. When the focal point of OL approaches that of the object, $v_1$ approaches infinity and the total magnification approaches $v_2/u_1$. Thus, the range of magnification for this type of dual lens system is between $v_2/(L+u_1)$ and $v_2/u_1$.

Figure 5:
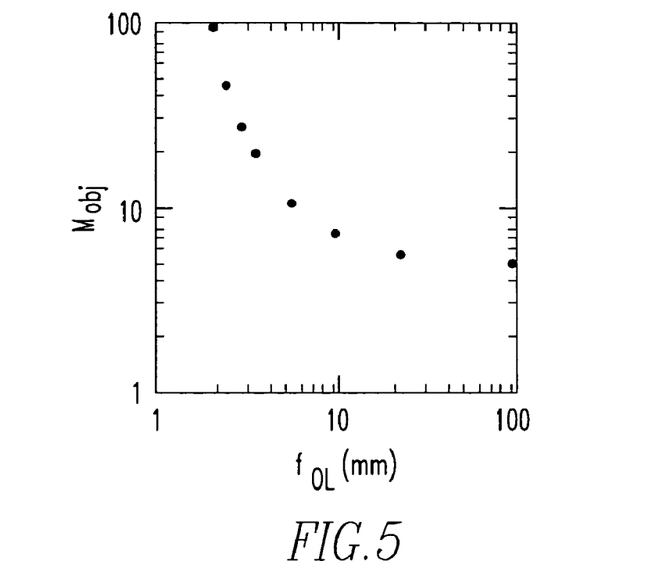
FIG. 5 is a graph showing the measured magnification at the fixed intermediate image plane versus focal length of objective lens.

The result of magnification at the intermediate image plane with the different focal lengths of the objective lens is shown in FIG. 5. As the focal point of objective lens approaches the object, the magnification increases dramatically.

When a given voltage is applied to the filament 11 to operate the electron biprism 7, the electron beam transmitted through the specimen 3 is divided into two by the filament 11. The resulting two portions of the electron beam overlap each other, producing interference. Interference fringes are created in the region in which interference occurs.

Since the electron beam transmitted through the specimen contains information about an object of interest, the beam is known as an object wave. The electron beam transmitted through a vacuum adjacent the specimen is not affected at all and, therefore, can provide a reference. Hence, this beam is termed a reference wave. The interference fringes created in the interference region are known as an electron hologram The electron hologram created by the electron biprism 7 is magnified by the rear intermediate lenses 8 and projector lens 9 and focused onto the observation/recording device 10.

Figure 6:
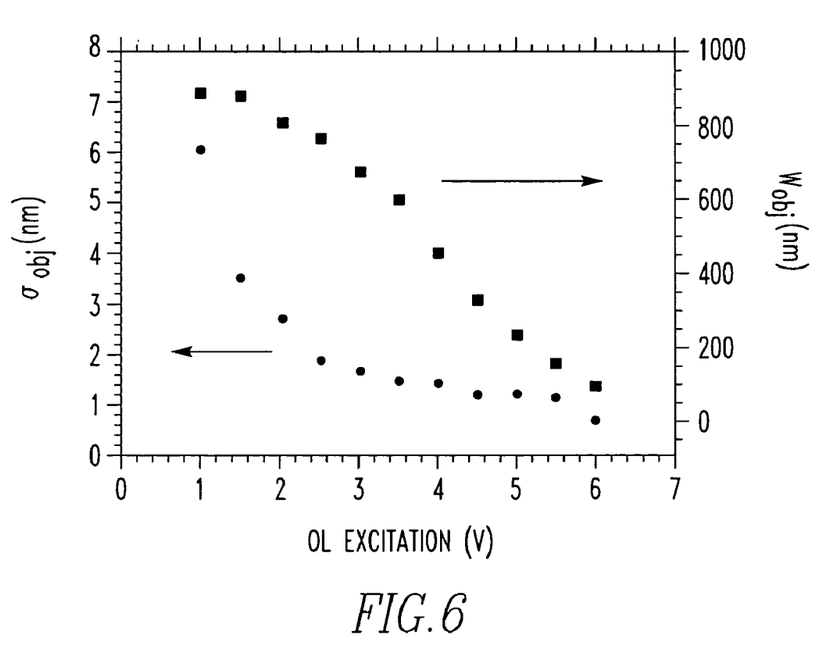
FIG. 6 illustrates fringe spacing, $\sigma_{obj}$ (circle), and fringe width, $W_{obj}$ (square), relative the object are plotted against OL excitation with a constant biprism voltage of 20V.

Both fringe spacing and width at a constant biprism voltage (20V) decrease as the strength of OL increases, although at different rates. This behavior is illustrated in FIG. 6.

The dual lens system described above has several advantages over a conventional single lens system: range of achievable $\sigma_{obj}$ and $W_{obj}$, control of fringe contrast, and control of the image plane position. First, a wide range of $\sigma_{obj}$ and $W_{obj}$, at nearly constant contrast, can be achieved by varying overall magnification via OL excitation. The upper limit for OL excitation is governed by the requirement that the focal length of OL must be greater than objective distance to achieve a virtual image of OL. For a JEOL 2010F FETEM the limit is ~6.7 V and allows both $\sigma_{obj}$ and $W_{obj}$ to vary by an order of magnitude while keeping the biprism voltage constant. These ranges (FIG. 6) are ideally suited for semiconductor device characterization.

A second advantage is that dual lens operation allows $\sigma_{obj}$ and $W_{obj}$ to be varied by OL and OM excitations. This removes the restriction for single lens operation where the biprism voltage is the only major parameter to be used to control the limited usable range of $\sigma_{obj}$ and $W_{obj}$. It allows $\sigma_{obj}$ and $W_{obj}$ to be adjusted without sacrificing fringe contrast. Another advantage of dual lens operation is that the position of intermediate image plane can be maintained at a fixed position with varying magnification. This simplifies the operation of the projection lenses and renders "b" in Eq. (4) a constant. However, if warranted, the image plane can also be changed with dual lens operation. For instance, raising the image plane position closer to the biprism (reducing b) increases the fringe contrast at the same time reducing the fringe width and spacing, according to Eqs. (4), (5), (9), and (10). The combination of dual lens system with properly selected intermediate image plane position widens the range of electron holography operation even further.

EXAMPLE

To demonstrate the flexibility of the dual lens method, we obtained electron holograms of pFET devices with poly silicon gate lengths of 220 nm and 70 nm on bulk Si and silicon on insulator (SOI) substrate, respectively. Samples were prepared by mechanically polished to a thickness of ~400 nm and subsequently ion milled to a final thickness of ~200–300 nm. To reduce the effects of charging, samples were coated on one side with ~20 nm of carbon. The biprism voltage was held constant at ~20V. Potential maps were reconstructed using the ASU plug-ins to Gatan Digital Micrograph. (see M. R. McCartney, *Ultramicroscope* 53, p. 283 (1994).

Contour potential maps for the two devices are shown in FIG. 7. Both devices exhibit symmetric doping profiles and the expected 1.0 V potential drop across the junctions. The intensity of the maps near the sides of the gates (side wall spacers and $CoSi_2$) are wrapped over due to phase wrapping. As summarized in Table I, both $\sigma_{obj}$ and $W_{obj}$ can be scaled without lost of contrast by simply varying OL excitation. This allows the characterization of different size devices.

In high performance CMOS logic devices, low dose ion implants are placed between the channel and the low resistivity (high dose) source/drain regions. In FIG. 7b, the upper curved portion of the P-N junction on either side of the device channel represents the result of such a low dose implant, which is clearly visible due to the high spatial resolution in the corresponding hologram from which the potential map was reconstructed.

TABLE I

Figure 7A:
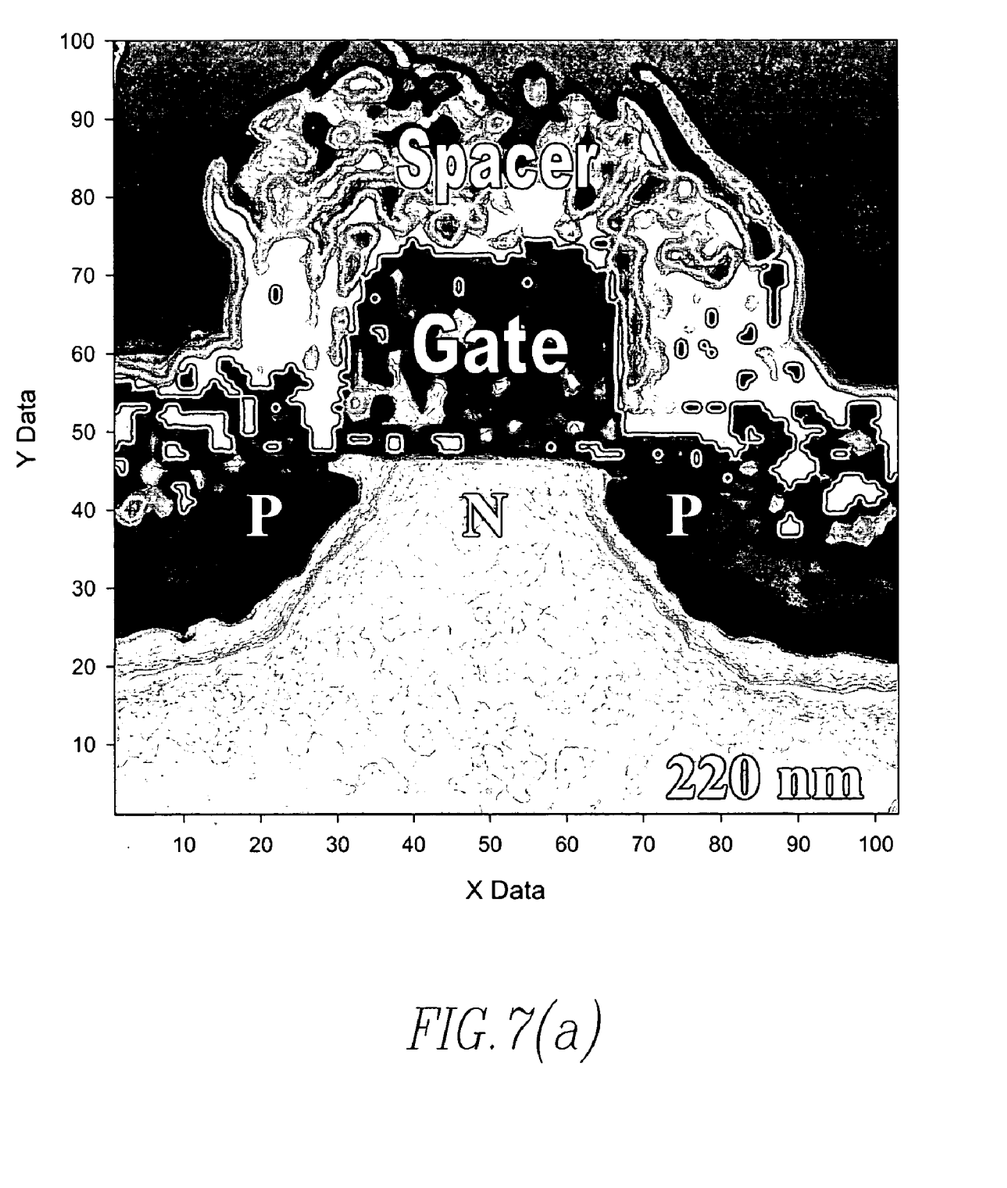
FIGS. 7a and 7b are potential maps of pFET devices made with the method of this invention.
Figure 7B:
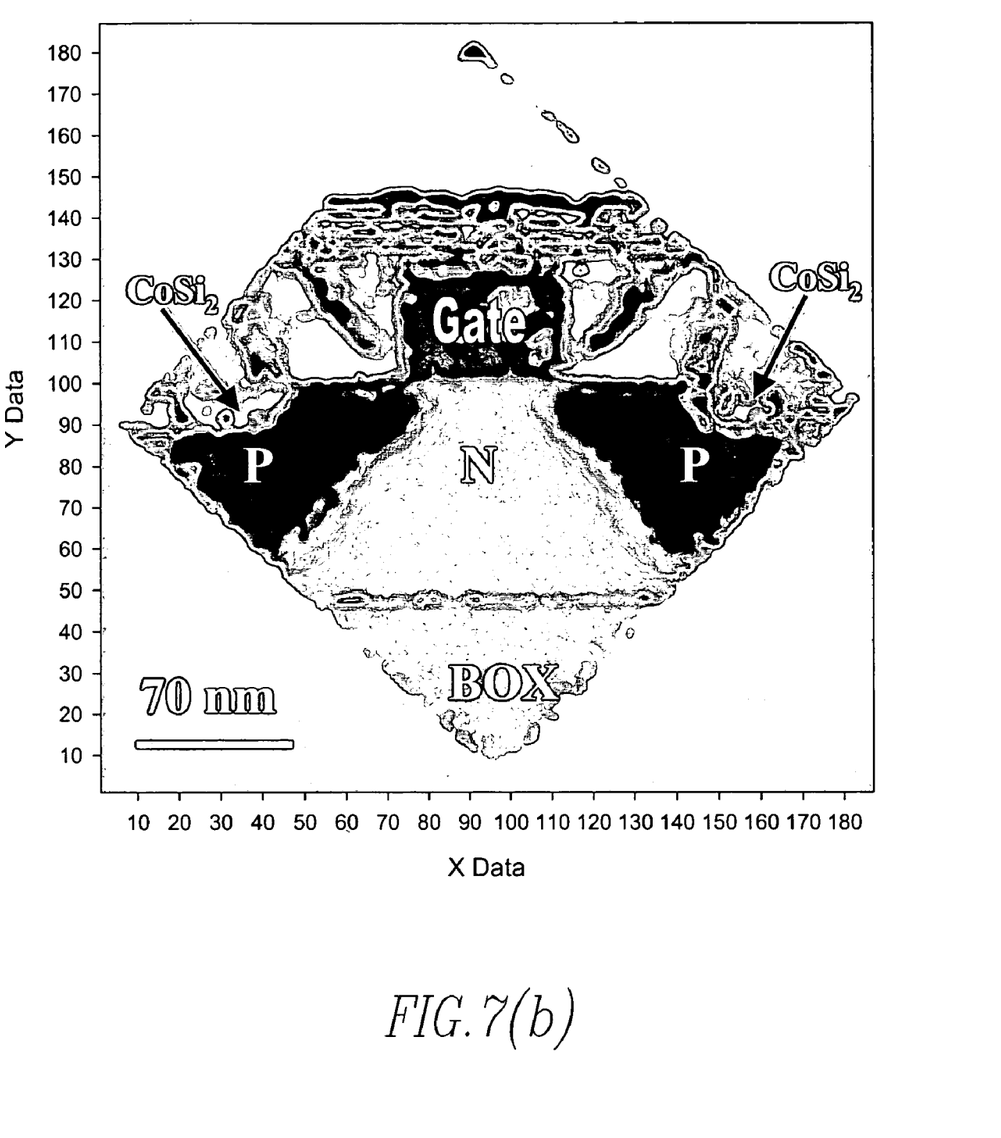

Experimental conditions of two potential maps shown in FIGS. 7a and 7b.

|  | 220 nm Gate | 70 nm Gate |
| --- | --- | --- |
| OL voltage (V) | 2.0 | 3.5 |
| Fringe Spacing, $\sigma_{obj}$ (nm) | 2.5 | 1.4 |
| Fringe Width, $W_{obj}$ (nm) | 800 | 575 |
| $M_{obj}$ | 5.7 | 14.8 |
| Contrast (reference hologram) | 10% | 11% |

Having this described our invention with the detail and particularity required by the Patent Laws, what is desired protected by Letters Patent is set forth in the following claims:

1. An inline electron holograph method for observing a specimen with a transmission electron microscope having an electron gun for emitting an electron beam, a collimating lens system, two spaced objective lenses, a biprism, for combining a portion of the electron beam transmitted through the specimen with a portion bypassing the specimen, and an imaging means comprising the steps of:

with the first objective lens forming a virtual image of a portion of the specimen;

with the second objective lens focussing the virtual image at an intermediate image plane to form an intermediate image;

with the biprism causing the two portions of the electron beam to overlap such that an interference pattern is formed at the image plane; and projecting the intermediate image onto the imaging means.

2. An inline electron holograph method for observing a specimen with a transmission electron microscope having a field emission electron gun for emitting an electron beam, a collimating lens system, two spaced objective lenses, a biprism for combining a portion of the electron beam transmitted through the specimen with a portion bypassing the specimen, and an imaging means located at an image plane comprising the steps of:

with the first objective lens forming a virtual image of a portion of the semiconductor device;

with the second objective lens focussing the virtual image at an intermediate image plane beyond the biprism to form an intermediate image;

with the biprism causing the two portions of the electron beam to overlap such that an interference pattern is formed at the image plane;

adjusting the magnification of both of the objective lenses and the voltage applied to the biprism to provide a continuously variable field of view between 5 and 2,000 nanometers and a continuously variable fringe spacing of between 0.1 and 30 nanometers; and projecting the intermediate image onto the imaging means.

3. An inline electron holograph method according to claim 2, wherein as the magnification is varied by the first objective lens, the intermediate image plane is fixed.

4. An inline electron holograph method according to claim 2, wherein as the magnification is varied by the first objective lens, the intermediate image plane is variable.

5. An inline intermediate image method according to claim 2, wherein the continuously variable fringe spacing is between 0.1 and 30 nanometers.

* * * * *